United States Patent
Xu et al.

(10) Patent No.: US 9,531,571 B2
(45) Date of Patent: Dec. 27, 2016

(54) AGILE RADIO ARCHITECTURE

(71) Applicant: HRL Laboratories, LLC, Malibu, CA (US)

(72) Inventors: Zhiwei A. Xu, Los Angeles, CA (US); Yen-Cheng Kuan, Los Angeles, CA (US); James Chingwei Li, Simi Valley, CA (US); Donald A. Hitko, Grover Beach, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/144,767

(22) Filed: Dec. 31, 2013

(65) Prior Publication Data

US 2015/0188737 A1    Jul. 2, 2015

(51) Int. Cl.
  *H04L 25/00* (2006.01)
  *H04L 25/08* (2006.01)
  *H03D 7/14* (2006.01)

(52) U.S. Cl.
  CPC ............ *H04L 25/08* (2013.01); *H03D 7/1441* (2013.01); *H03D 7/1458* (2013.01)

(58) Field of Classification Search
  CPC ...... H04B 1/0082; H04B 1/0075; H04B 1/403
  USPC ..................................................... 455/77, 84
  See application file for complete search history.

(56) References Cited

U.S. PATENT DOCUMENTS

| | | | |
|---|---|---|---|
| 5,508,661 A * | 4/1996 | Keane et al. | 331/37 |
| 5,859,570 A | 1/1999 | Itoh et al. | |
| 6,504,867 B1 * | 1/2003 | Efstathiou | 375/227 |
| 7,212,587 B2 * | 5/2007 | Khlat | H03F 1/304 375/319 |
| 7,362,174 B2 * | 4/2008 | Cao | 330/253 |
| 7,831,210 B1 * | 11/2010 | Freeman et al. | 455/73 |
| 2004/0166804 A1 * | 8/2004 | Moloudi et al. | 455/20 |
| 2005/0255822 A1 * | 11/2005 | Friedrich et al. | 455/323 |
| 2006/0094391 A1 * | 5/2006 | Darabi | 455/323 |

(Continued)

FOREIGN PATENT DOCUMENTS

| | | |
|---|---|---|
| KR | 10-2001-0037302 | 5/2001 |
| KR | 10-2011-0029662 | 3/2011 |
| KR | 10-2013-0076228 | 7/2013 |

OTHER PUBLICATIONS

International Search Report and Written Opinion for PCT/US2014/064674 mailed Feb. 6, 2015.

(Continued)

*Primary Examiner* — Wen Huang
(74) *Attorney, Agent, or Firm* — Ladas & Parry

(57) ABSTRACT

An agile transceiver including a receiver channel that includes an input, a coarse tracking filter coupled to the input, the coarse tracking filter having a set of at least two bandpass filters for filtering signals from the input into at least two coarse pass bands, a mixer coupled to an output of the coarse tracking filter, a selected local oscillator coupled to the mixer for mixing with the output of the coarse tracking filter and shifting a desired coarse pass band to near a base band, a fine tracking filter for filtering the shifted and desired coarse pass band to a fine pass band, and a band pass $\Sigma\Delta$ demodulator for converting signals in the fine pass band from analog into digital. The agile transceiver may include a corresponding transmitter channel.

32 Claims, 11 Drawing Sheets

(56) References Cited

U.S. PATENT DOCUMENTS

| | | | |
|---|---|---|---|
| 2006/0133532 A1* | 6/2006 | Jensen et al. | 375/279 |
| 2006/0205352 A1* | 9/2006 | Bialek et al. | 455/63.3 |
| 2009/0168800 A1* | 7/2009 | Leinonen et al. | 370/464 |
| 2009/0274249 A1* | 11/2009 | Okada et al. | 375/344 |
| 2012/0274367 A1* | 11/2012 | Yeo et al. | 327/113 |
| 2013/0244601 A1 | 9/2013 | Dickey et al. | |
| 2014/0073268 A1* | 3/2014 | Taniuchi | H01P 1/10 455/83 |

OTHER PUBLICATIONS

J. L. Shanton in "A software defined radio transformation," IEEE Military Communication Conference, pp. 1-5, 2009.

J. Craninckx, et al in "A fully configurable software-defined radio transceiver in 0.13 82 m CMOS," IEEE ISSCC, pp. 346-247 and 607, 2007.

I. Hatai, I. Chakrabarti in "A high-speed, ROM-less DDFS for software defined radio system," IEEE International Conference on Communication Control and Computing Technologies, pp. 115-119.

D. Agarwal, C.R. Anderson, and P.M. Athanas in "An 8GHz ultra wideband transceiver prototyping testbed," IEEE International workshop on Rapid System Prototyping, pp. 121-127, 2005.

R. Bagheri, A. Mirzaei, S. Chehrazi, M.E. Heidari, Minjae Lee, M. Mikhemar, Wai Tang, and A.A. Abidi in "An 800-MHz-6-GHz software defined wireless receiver in 90-nm CMOS," IEEE JSSC, vol. 41, No. 12, pp. 2860-2876, 2006.

K. Koli, S. Kallioinen, J. Jussila, P. Sivonen, and A. Parssinen, "A 900-MHz Direct Delta-Sigma Receiver in 65-nm CMOS," IEEE JSSC, vol. 45, No. 12, pp. 2807-2818, Dec. 2010.

N. Beilleau, H. Aboushady, F. Montaudon, and A. Cathelin in "A 1.3V 26mV 3.2GS/s undersampled LC bandpass ΣΔ ADC for a SDR ISM-band receiver in 130nm CMOS," IEEE RFIC, pp. 383-386, 2009.

Chapter II, International Preliminary Report on Patentability (IPRP) from PCT/US2014/064674 mailed on Dec. 14, 2015.

* cited by examiner

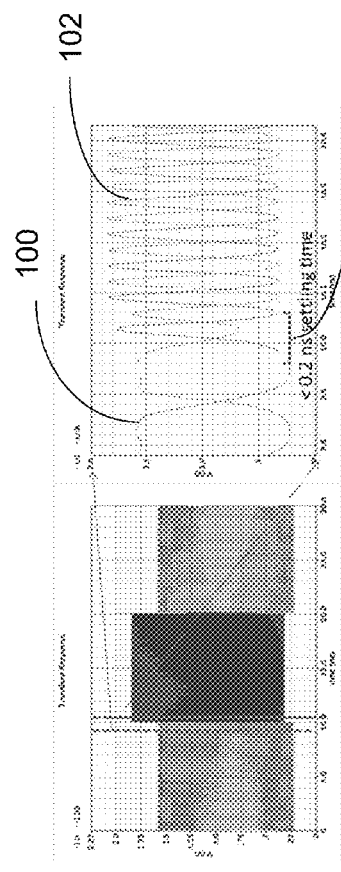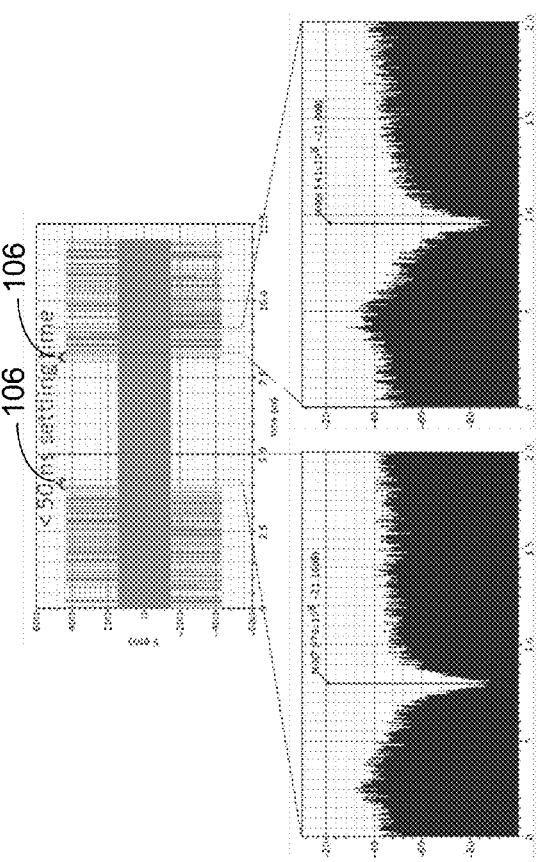
FIG. 8A  FIG. 8B  FIG. 8C

AGILE RADIO ARCHITECTURE

CROSS REFERENCE TO RELATED APPLICATIONS

None

TECHNICAL FIELD

This disclosure relates to radio frequency (RF) transceivers and in particular to reconfigurable and/or programmable radio frequency (RF) transceivers.

BACKGROUND

RF transceivers that may be reconfigured and/or programmed have been sought after for many years. Conventionally, several radios for different applications were put together to provide a solution with some limited configurability. However, such architectures do not offer upgradability, because adding support for different frequencies requires significant radio redesign. A common platform is preferred to process all wireless signals if it can offer small form factor, low cost and low power consumption. Further, it is preferable to have a radio that can be configured to support different applications within a micro second. These features are not supported by the prior art.

J. L. Shanton in "A software defined radio transformation," IEEE Military Communication Conference, pp. 1-5, 2009 describes a software defined radio architecture, which extends existing high frequency/very high frequency/ultra-high frequency (HF/VHF/UHF) radio functions. However, the disclosed radio mainly works in low frequency and does not address high frequency band.

J. Craninckx, et al in "A fully configurable software-defined radio transceiver in 0.13 µm CMOS," IEEE ISSCC, pp. 346-607, 2007 describe a software defined radio that can support 1-5 GHz RF signal processing with a configurable baseband bandwidth from 0.35 MHz to 23 MHz for receiving and 1 to 16 MHz for transmitting, as shown in FIG. 1A. Craninckx does not disclose the application switching speed; however, based upon the local oscillator (LO) generation architecture used by Craninckx, as shown in FIG. 1B, the switching time is expected to be as long as tens of micro seconds, because the LO switching is governed by a limited loop bandwidth, which requires a long settling time.

I. Hatai, I. Chakrabarti in "A high-speed, ROM-less DDFS for software defined radio system," IEEE International Conference on Communication Control and Computing Technologies, pp. 115-119, 2010 disclosed using a Direct Digital Synthesizer (DDS) as a LO, as shown in FIG. 2, for a software defined radio, in order to provide a very fast channel switching time. However, such configurations are often constrained by the low output frequency of the synthesized clock, which is normally a fraction of the input clock frequency, which suggests a very high frequency operation of the DDS to support a wide band radio. However, such very high frequency operation would result in excessive power consumption. Also problematic are spurs of the DDS, which could be as high as −40 dBc for a high frequency output.

In the prior art, as advanced digital integrated circuit technologies arrived, people tried to direct digitize the incoming signal from the front low noise amplifier (LNA) and perform signal processing in the digital domain with enormous flexibility.

D. Agarwal, C. R. Anderson, and P. M. Athanas in "An 8 GHz ultra wideband transceiver prototyping testbed," IEEE International workshop on Rapid System Prototyping, pp. 121-127, 2005 disclose a testbed with such an architecture, as shown in FIG. 3. This architecture uses several high-speed analog to digital converters (ADCs) to perform interleaved sampling at a high aggregate rate; however, the actual processing signal bandwidth is constrained by each ADC performance. Many other attempts have also used a similar architecture. Though this architecture can provide fast channel switching, it imposes a very high dynamic range requirement on the ADCs due to the concurrent wideband processing. Therefore, the associated power consumption is extremely high, which makes the architecture difficult to integrate into some applications. In particular, this architecture's power consumption will increase drastically with a wider signal bandwidth, so the architecture is difficult to use for ultra wide band applications.

R. Bagheri, A. Mirzaei, S. Chehrazi, M. E. Heidari, Minjae Lee, M. Mikhemar, Wai Tang, and A. A. Abidi in "An 800-MHz-6-GHz software defined wireless receiver in 90-nm CMOS," IEEE JSSC, vol. 41, No. 12, pp. 2860-2876, 2006 describe a software defined radio receiver from a low power anti-aliasing filter perspective, exploiting programmability of windowed integration sampler and clock-programmable discrete time analog filters, as shown in FIG. 4. The radio receiver disclosed has a wideband RF frontend with a low noise amplifier and a wide tuning range synthesizer spanning over 800 MHz to 6 GHz to cover the desired band. Owing to its narrow band signal processing, the receiver achieves low power consumption, which is on the same order of other customized radio receivers. However, its discrete filtering scheme inevitably introduces the spurs due to a switching clock. Also its frequency synthesizer does not provide fast channel switching, but rather has a switching time longer than tens of micro second.

K. Koli, S. Kallioinen, J. Jussila, P. Sivonen, and A. Parssinen, "A 900-MHz Direct Delta-Sigma Receiver in 65-nm CMOS," IEEE JSSC, vol. 45, No. 12, pp. 2807-2818, December 2010 disclose a direct delta-sigma receiver architecture based upon direct down-conversion, delta-sigma feedback that is up-converted to RF, and an N-path filtering technique, as shown in FIG. 5. This design processes the signal in a narrow band and exploits delta sigma modulation to achieve both excellent Signal to Noise-plus-Distortion Ratio (SNDR) and low power consumption. However, this architecture relies on an LO to configure the circuit center frequency, therefore the architecture does not provide fast channel switching.

N. Beilleau, H. Aboushady, F. Montaudon, and A. Cathelin in "A 1.3V 26 mV 3.2 GS/s undersampled LC bandpass $\Sigma\Delta$ ADC for a SDR ISM-band receiver in 130 nm CMOS," IEEE RFIC, pp. 383-386, 2009 disclose an under-sampled LC bandpass $\Sigma\Delta$ modulator to directly convert the signal from the low noise amplifier (LNA) into digital data. This design achieves low power consumption and decent signal SNDR due to narrow band processing and use of a $\Sigma\Delta$ algorithm. However, this design, as shown in FIG. 6, lacks frequency tunability and is not able to process a very wide RF frequency.

What is needed is a radio architecture that is able to provide fast channel switching and cover a wide band without consuming significant amounts of power. The embodiments of the present disclosure answer these and other needs.

SUMMARY

In a first embodiment disclosed herein, an agile transceiver comprises a receiver channel comprising a coarse tracking filter coupled to an input, the coarse tracking filter having a set of at least two bandpass filters for filtering signals from the input into at least two coarse pass bands, a mixer coupled to an output of the coarse tracking filter, a selected local oscillator coupled to the mixer for mixing with the output of the coarse tracking filter and shifting a desired coarse pass band to near a base band, a fine tracking filter for filtering the shifted and desired coarse pass band to a fine pass band, and a band pass $\Sigma\Delta$ demodulator for converting signals in the fine pass band from analog into digital.

In another embodiment disclosed herein, an agile transceiver comprises a transmitter channel comprising a band pass $\Sigma\Delta$ modulator for converting signals from a transmit input from digital to analog, a fine tracking filter for filtering an output of the band pass $\Sigma\Delta$ modulator to a fine transmit pass band, a mixer coupled to an output of the fine tracking filter, a local oscillator coupled to the mixer for mixing with the output of the fine tracking filter and shifting the fine transmit pass band to a desired coarse transmit pass band, and a coarse tracking filter coupled an output of the mixer, the coarse tracking filter having a set of at least two bandpass filters, and the coarse tracking filter for filtering signals from the mixer that are not in the desired coarse transmit pass band.

In yet another embodiment disclosed herein, a circuit for implementing a band pass $\Sigma\Delta$ modulator, a mixer, and a fine tracking filter comprises a band pass $\Sigma\Delta$ modulator having output bits $D_1$ to $D_N$, and inverted output bits for $D_1$ to $D_N$, a local oscillator (LO) having an output LO and an inverted output for the LO, wherein each bit of $D_1$ to $D_N$, and each inverted bit of $D_1$ to $D_N$ is connected to a respective gate of two respective pairs of FETs, the FETs in each pair of FETs having their drains connected, wherein each source for a FET having an inverse of a bit connected to a gate of the FET is connected to a voltage source, wherein each source for one FET of a respective pair of FETs having a bit that is not inverted connected to a gate of the FET is connected to an inductor in series with a resistor connected to the voltage source, wherein each source for the second FET of a respective pair of FETs having a bit that is not inverted connected to a gate of the FET is connected to a second inductor in series with a second resistor connected to the voltage source, wherein the connected drains of one respective pair of FETs for each bit is connected to a source of a respective FET with a gate connected to the output LO and a drain connected to a ground, and wherein the connected drains of the second respective pair of FETs for each bit is connected to a source of a respective FET with a gate connected to the inverted output for the LO and a drain connected to the ground.

In still another embodiment disclosed herein, a method of providing an agile transceiver comprising a receiver channel comprises forming a coarse tracking filter coupled to an input, the coarse tracking filter having a set of at least two bandpass filters for filtering signals from the input into at least two coarse pass bands, forming a mixer coupled to an output of the coarse tracking filter, forming a selected local oscillator coupled to the mixer for mixing with the output of the coarse tracking filter and shifting a desired coarse pass band to near a base band, forming a fine tracking filter for filtering the shifted and desired coarse pass band to a fine pass band, and forming a band pass $\Sigma\Delta$ demodulator for converting signals in the fine pass band from analog into digital.

In still yet another embodiment disclosed herein, a method of providing an agile transceiver comprising a transmitter channel comprises forming a band pass $\Sigma\Delta$ modulator coupled to a transmit input for converting signals from the transmit input from digital to analog, forming a fine tracking filter for filtering an output of the band pass $\Sigma\Delta$ modulator to a fine transmit pass band, forming a mixer coupled to an output of the fine tracking filter, forming a local oscillator coupled to the mixer for mixing with the output of the fine tracking filter and shifting the fine transmit pass band to a desired coarse transmit pass band, and forming a coarse tracking filter coupled an output of the mixer, the coarse tracking filter having a set of at least two bandpass filters, and the coarse tracking filter for filtering signals from the mixer that are not in the desired coarse transmit pass band.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 8A, 8B and 8C show simulation results for the agile radio of FIG. 7 in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figures 1A, 1B:
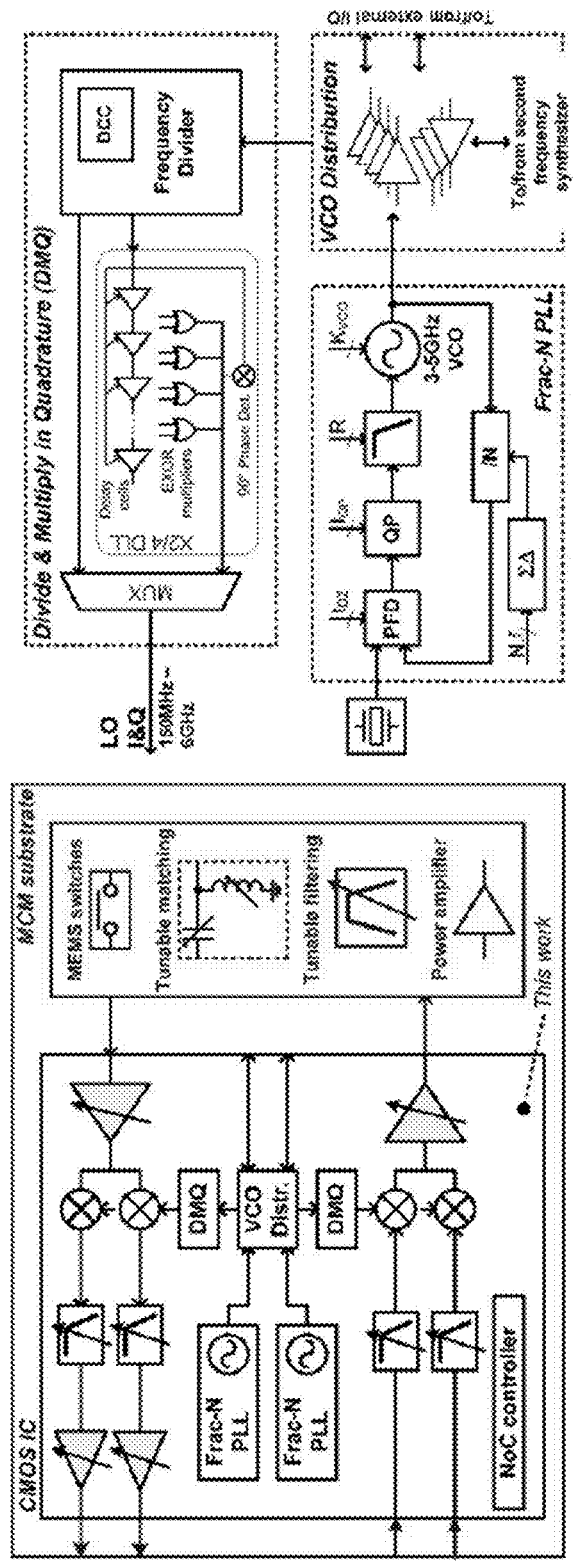
FIG. 1A shows a software defined radio architecture and FIG. 1B shows an LO generation architecture used for the radio of FIG. 1A in accordance with the prior art.
Figure 2:
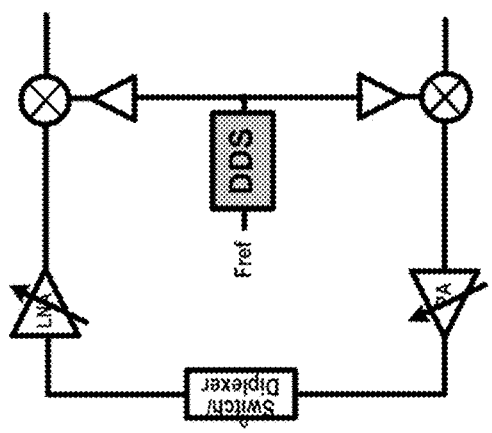
FIG. 2 shows a software defined radio architecture that uses a direct digital synthesizer (DDS) as the LO source in accordance with the prior art.
Figure 3:
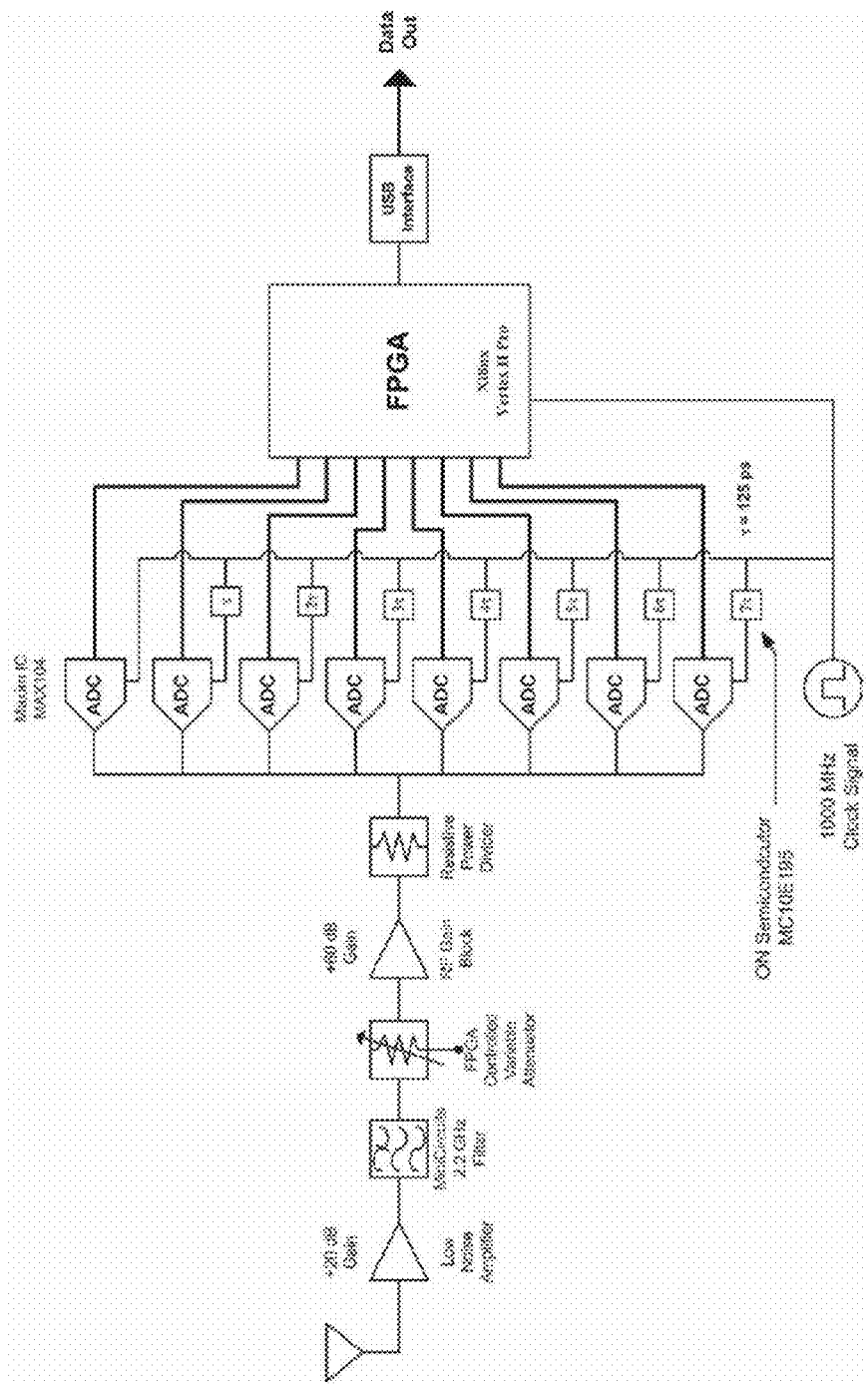
FIG. 3 shows a software defined ultra-wideband communication system in accordance with the prior art.
Figure 4:
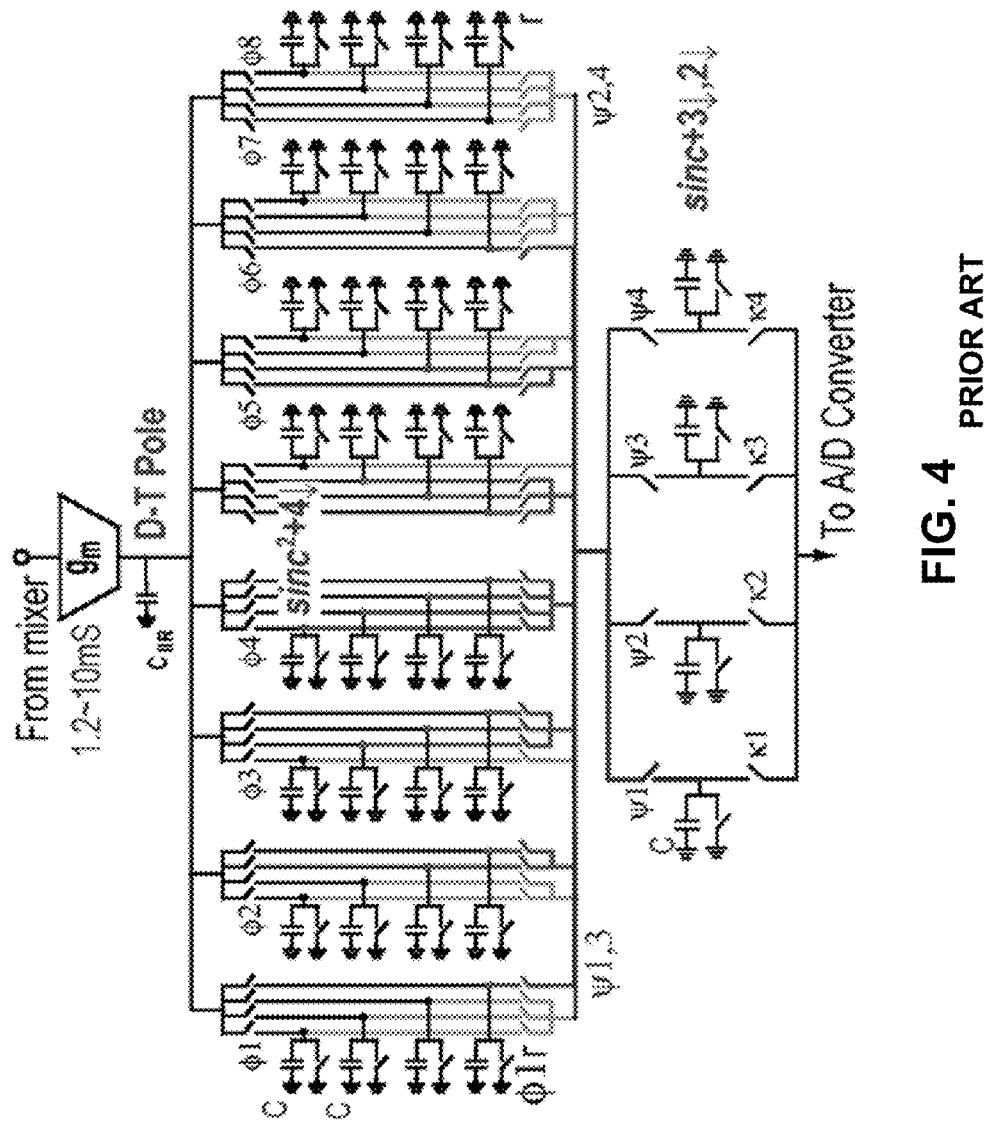
FIG. 4 shows an anti-aliasing sampler and subsequent decimation stages in a software defined radio architecture in accordance with the prior art.
Figure 5:
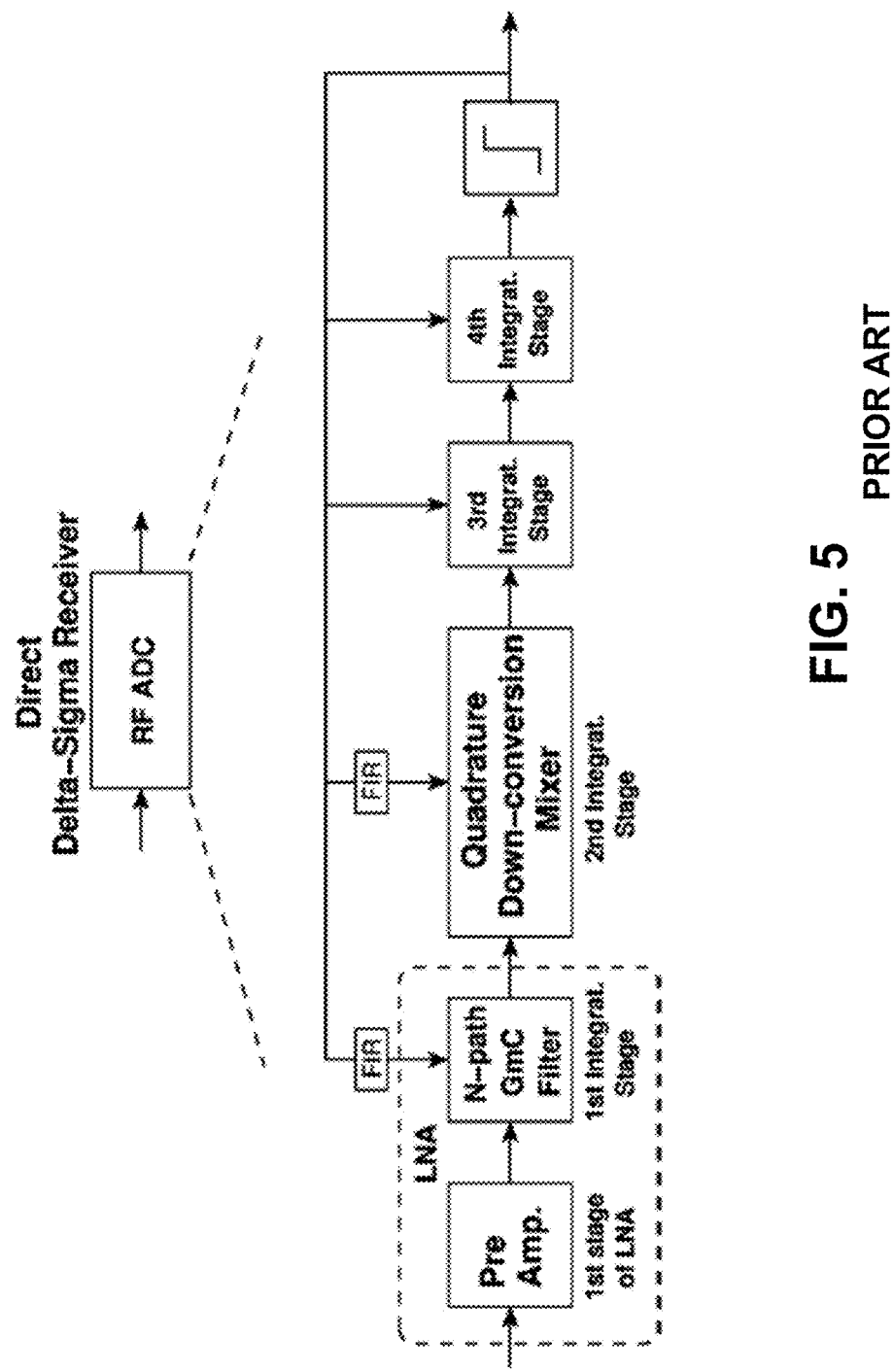
FIG. 5 shows a $4^{th}$ order direct delta-sigma receiver in accordance with the prior art.
Figure 6:
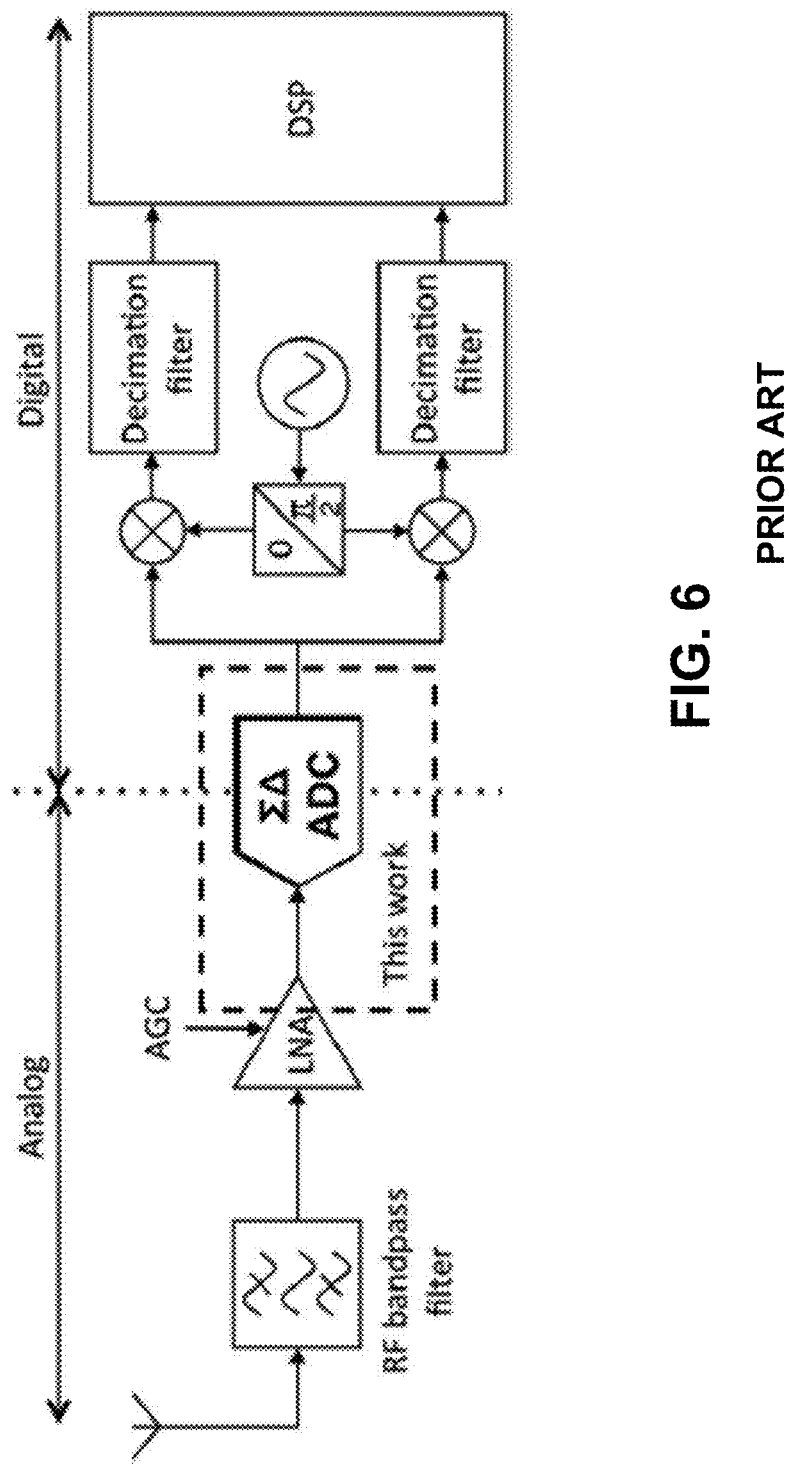
FIG. 6 shows an RF Receiver architecture based on an LC bandpass $\Sigma\Delta$ demodulator in accordance with the prior art.
Figure 7:
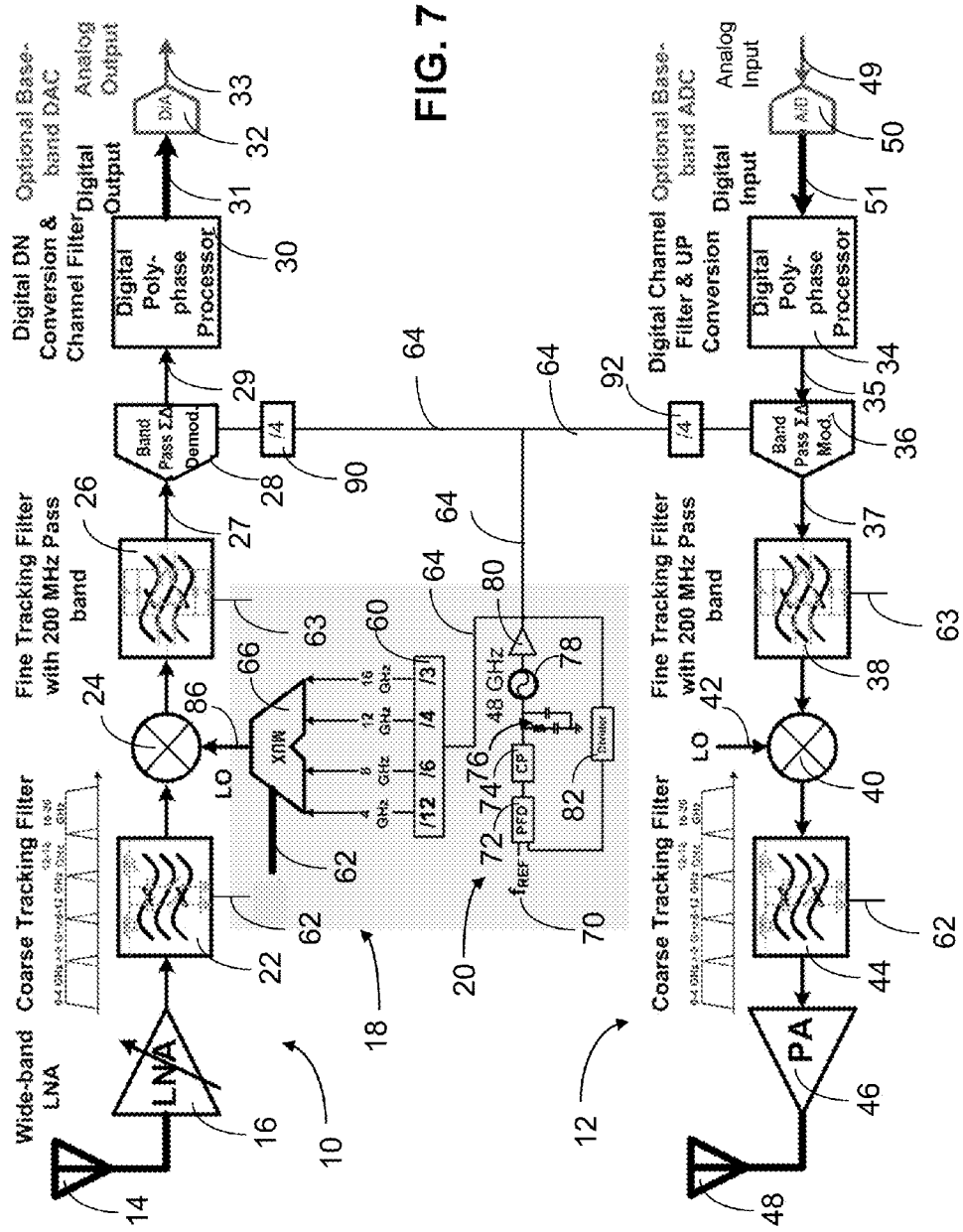
FIG. 7 shows a block diagram of an agile radio with receiver channel and a transmitter channel in accordance with the present disclosure.

FIG. 7 shows a block diagram of an agile radio architecture in accordance with the present disclosure. The receiver channel 10 of the agile radio and the transmitter channel 12 of the agile radio are shown. The receiver channel 10 has an antenna 14, a low noise amplifier (LNA) 16, a coarse tracking filter 22, a switchable LO generator 18 using a fixed frequency synthesizer 20, a mixer 24 driven by a selected local oscillator (LO) 86, a fine tracking filter 26, a configurable band pass ΣΔ demodulator 28, and a digital poly-phase processor 30. The receiver channel 10 as shown in FIG. 7 has wide band coverage, which may be 0.1-20 GHz, fast channel switching, which may be less than 100 ns, and low power consumption. An optional digital to analog converter (D/A) 32 may follow the digital poly-phase processor 30, which provides a digital output, in order to provide an analog output 33. The analog output 33 provides backward compatibility to accommodate existing radios, which may only receive analog baseband signals.

The transmitter channel 12 of the agile radio may include a digital poly-phase processor 34, a configurable band pass ΣΔ modulator 36, a fine tracking filter 38, a mixer 40 driven by a selected local oscillator (LO) 42, which may be the same as the switchable LO generator 18 with the fixed frequency synthesizer 20, a coarse tracking filter 44, a power amplifier (PA) 46, and an antenna 48, which may be the same as antenna 14. The transmitter channel 12 also has wide band coverage, which may be 0.1-20 GHz, fast channel switching, which may be less than 100 ns, and relatively low power consumption compared to the prior art. An optional analog to digital converter (A/D) 50 may precede the digital poly-phase processor 34, which has a digital input 51, in order to provide an analog input 49 rather than a digital input. The analog input 49 provides backward compatibility to accommodate existing radios, which may only transmit analog baseband signals.

Although FIG. 7 shows an agile radio with the switchable LO generator 18, a fixed frequency synthesizer 20 and the coarse tracking filter 22 with frequencies and bands for 0 to 20 GHz operation, this disclosure is not limited to such bands and a person skilled in the art would understand that the switchable LO generator 18, the fixed frequency synthesizer 20 and the coarse tracking filter 22 filters and other configurable blocks of FIG. 7 may be varied to change the frequencies and bands of operation.

The very fast channel switching, wide RF band processing capability, and low power consumption of the agile radio enables an on-the-fly programmable radio platform for communication, radar and EW applications.

The low noise amplifier (LNA) 16 and the power amplifier (PA) 46 are both wide band. The LNA 16 may have a number of gain settings including for example 0 dB, 15 dB, and 10 dB. The PA 46 may also have a number of gain settings. In the receive channel the coarse RF tracking filter 22 and the fine RF tracking filter 26 reduce the linearity requirements needed for the ΣΔ demodulator 28 and the digital poly-phase processor 30. In the transmit channel the coarse RF tracking filter 44 and the fine RF tracking filter 38 reduce the aliasing of frequencies at the PA 46. The ΣΔ demodulator 28 digitizes the incoming low frequency RF signals 27 into digital data in the receiver channel 10, and the ΣΔ modulator 36 translates digital data 35 into an RF signal 37 in the transmitter channel 12. The digital poly-phase based signal processor 30 down converts a received signal into baseband, so that the received signal is near 0 Hz, and performs further channel filtering in the receiver channel 10. The digital poly-phase based signal processor 34 up converts a baseband signal 51 in the transmitter channel 12.

The LO generator 18 includes a fixed frequency synthesizer 20, a set of dividers 60, and a multiplexer 66 to provide a switchable local oscillator (LO) 86 across a wide frequency range with near instantaneous programmability for the receiver channel 10. The LO generator 18, or a similar separate LO generator, provides a switchable local oscillator (LO) 42 across a wide frequency range with near instantaneous programmability for the transmitter channel 12. The switching of both LO 86 and LO 42 may be less than 10 nanoseconds (ns).

FIG. 7 shows an embodiment example to feature the proposed architecture covering a 0-20 GHz frequency band. In this example, the transceiver partitions the entire 0-20 GHz into 5 coarse frequency bands: 0-4 GHz, 4-8 GHz, 8-12 GHz, 12-16 GHz, and 16-20 GHz. The coarse RF tracking filters 22 and 44 are configurable by control 62 to operate at a selected coarse frequency band and to attenuate signals in the other frequency bands. The coarse RF tracking filters 22 and 44 may have 5 settings to partition a band into 0-4 GHz, 4-8 GHz, 8-12 GHz, 12-16 GHz, and 16-20 GHz bands. The selected coarse frequency band for the receive channel 10 may be different than the selected coarse frequency band for the transmit channel 12.

The fixed frequency synthesizer 20 generates a high frequency signal 64 at 48 GHz. Then, the 48 GHz signal is divided in parallel by 3, 4, 6, and 12 in the set of dividers 60 to generate 16 GHz, 12 GHz, 8 GHz, and 4 GHz frequency signals, which serve as LO options. The selected LO 86 that is used to mix the output of the coarse tracking filter 22 to near baseband (0-4 GHz) is selected by control 62 from the four options through a multiplexer 66. Because the LO switching does not involve the settling time required by a synthesizer loop, the frequency switching time for the LO is not constrained by the synthesizer loop constant. Hence, it can surpass the channel switching time limitation of approximately 10 microseconds (μs) of a normal frequency synthesizer and can achieve a very fast channel switching time of 10 ns or less.

The fixed frequency synthesizer 20 to generate the high frequency signal 64 at 48 GHz, may be realized as shown in FIG. 7 from a $f_{ref}$ 70 using a phase frequency detector 72, a charge pump 74, a low pass filter, which may be implemented with a resistor-capacitor network 76, a voltage controlled oscillator 78, a buffer amplifier 80, and a divider 82, which is fed back to the phase frequency detector 72. The fixed frequency synthesizer 20 generates a high quality, high frequency signal 64 with no spurs.

The fine tracking filter 26 may have 20 selections to further partitions the selected 4 GHz RF band into multiple 200 MHz bands and selectively band-pass filter the desired 200 MHz signal band for the receive channel 10. The desired 200 MHz signal band may be selected by control 63. This filter attenuates any potentially out of band signals, which otherwise might jam the selected band, and avoids desensitizing the subsequent stages. Similarly, fine tracking filter 38 selectively band-pass filters the desired 200 MHz signal band for the transmit channel 12, which again may be selected by control 63. The selected 200 MHz signal band for the receive channel 10 may be different than the selected 200 MHz signal band for the transmit channel 12.

In the receive channel 10, the band pass ΣΔ demodulator 28 demodulates the incoming RF signals 27 into digital information 29. The band pass ΣΔ demodulator 28 may have 20 selections to cover a 4 GHz band. In the transmit channel 12, the band pass ΣΔ modulator 36 modulates digital input 35 into high frequency narrow band RF signals 37. As shown, in FIG. 7 the 48 GHz high frequency signal 64 is divided by 4 in divider 90 and provided to the band pass ΣΔ demodulator 28, and divided by 4 in divider 92 and provided to the band pass ΣΔ modulator 36. A person skilled in the art would know that the divide by 4 may be a divide by other factors depending on the design of the band pass ΣΔ demodulator 28 and band pass ΣΔ modulator 36, and other particulars of the receive 10 and transmit 12 channel design, such as the desired bands to be received and transmitted.

The digital poly-phase processor 30 in the receive channel 10 demodulates the high frequency digital bits 29 output from the band pass ΣΔ demodulator 28 to the baseband digital data 31 and performs channel filtering. The digital poly-phase processor 34 in the transmit channel 12 modulates the baseband digital data 51 into the high frequency digital bits 35 and performs channel filtering. The digital poly-phase processors 30 covers a 4 GHz band with a programmable bandwidth that may be 100 kHz or tens of MHz.

The digital poly-phase processors 30 and 34 may use powerful signal processors to form a filter with a bandwidth as narrow as 100 KHz, which is much finer than available with prior art RF tracking filters.

The agile radio architecture exploits the fast channel switching characteristics of both the selectable LO generator 18 based on a fixed frequency synthesizer 20 and programmable ΣΔ demodulator 28 and ΣΔ modulator 36. In the receiver channel, the selectable LO generator 18 provides the selected LO 86 to fold an input wide RF band into a relative narrow band with the assist of the coarse tracking filter 22 to filter out the jammers in the other frequencies and to attenuate aliasing. Then the programmable ΣΔ demodulator 28 further demodulates each desired narrow band RF signal with the aid of the fine band tracking filter 26. In transmitter channel 12, the programmable ΣΔ modulator 36 modulates incoming digital data 35 into a desired narrow band RF signal and the fine tracking filter 38 attenuates the aliases, then the modulated narrow band RF signal is converted into the design frequency by the selected LO 42 and the coarse tracking filter 44 further reduces the aliases and images.

The longest settling time for the agile radio occurs when the radio switches from the lowest possible frequency to the highest possible frequency or from the highest possible frequency to the lowest possible frequency, because, for example, in the receive channel 10 the selected LO 86, the fine tracking filter 26, and the ΣΔ demodulator 28 must all switch center frequencies. The same is true for corresponding elements in the transmit channel 12. Because the selected LO 86 switching is performed by selecting via multiplexer 66 one of the divided LOs from the set of dividers 60, which are already available, the LO 86 switching time only consumes the settling time of the multiplexer 66, which may be as short as 10 nanoseconds (ns). As shown in FIGS. 8A and 8B, which is a detail of FIG. 8A, a simulation has shown that the settling time 104 in switching from 4 GHz to 16 GHz may be as low as 0.2 nanoseconds (ns).

The band switching of the fine tracking filters 26 and 38 is by control 63. The band switching of the ΣΔ demodulator 28 and the ΣΔ modulator 36 is accomplished by a tank center frequency change and demodulator/modulator coefficient programming. Simulation shows that these band switches can be as fast as 50 ns, as shown by time 106 in FIG. 8C. Therefore, the total settling time for switching frequencies in the agile radio is shorter than 100 ns, and may be as short as 50.2 ns.

The combination of coarse tracking filtering, fine tracking filtering, and extremely fine digital filtering by the ΣΔ demodulator 28 and the ΣΔ modulator 36 and the digital poly-phase processors achieves excellent linearity performance and great system flexibility. By partitioning the filtering, each filter has a reduced Q requirement, and therefore can be easily implemented. In contrast, using a single filter to provide both wide frequency coverage and a fine frequency pass band would impose an extreme high Q requirement, which would be very challenging to realize.

A bank of ΣΔ demodulators/modulators may be used in the receive channel 10 and/or the transmit channel 12 to further increase the parallel processing capability of the agile radio. In this way the receive channel may receive multiple frequencies in parallel or the transmit channel may transmit multiple frequencies in parallel.

Also a finer frequency step size in the coarse tracking filters 22 and 44 may be used to simplify the fine tracking filter, the ΣΔ demodulator, the ΣΔ modulator and digital poly phase processor designs by reducing the processed band. For example, the 4 GHz bandwidth of the coarse tracking filters 22, as illustrated in FIG. 7, may be reduced to a lower bandwidth of 2 GHz.

Figure 9:
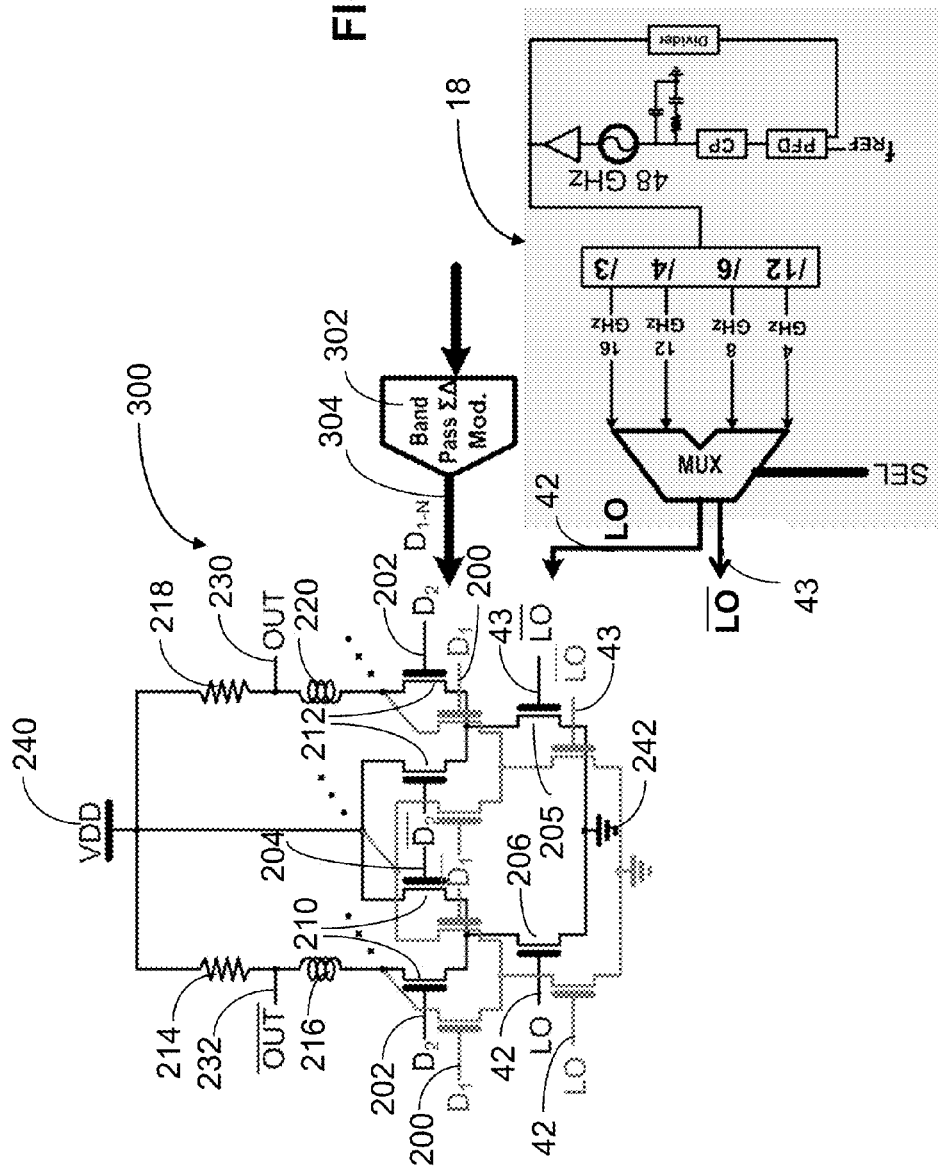
FIG. 9 shows a circuit for combining the band pass $\Sigma\Delta$ modulator, the mixer, and the fine tracking filter in the transmitter channel of FIG. 7 in accordance with the present disclosure.

FIG. 9 shows a circuit 300 that may be used for combining the bandpass ΣΔ modulator 36, mixer 40 and the fine tracking filter 38 functions in the transmitter channel 12 of FIG. 7. Shown in FIG. 9 is another bandpass ΣΔ modulator 302, which has an output 304 having $D_1$ to $D_N$ and also inverted versions of $D_1$-$D_N$. Also shown is the switchable LO generator 18, which has a selected LO output 42 and an inverted LO output 43.

The outputs of the bandpass ΣΔ modulator 302 and the switchable LO generator are connected to field effect transistors (FETs) arranged as shown in FIG. 9. Each bit and the inverse of the bit of the outputs 304 $D_1$ to $D_N$, is connected to a gate of a pair of FETs with their drains connected. For example, $D_2$ of the outputs 304 $D_1$ to $D_N$, and the inverse of $D_2$, are connected to gates 202 and 204 of FET pairs 210 and 212. The drains of each pair of FETs 210 and 212 have their drains connected. The source of one the FETs of a pair of FET is connected to a voltage 240 $V_{DD}$, and the source of the other FET in the pair of FETs is connected to an inductor, such as inductors 216 and 220, which are connected to voltage 240 through resistors 214 and 218, respectively.

The drains of each pair of FETs, such as the pair of FETs 210, are connected together and connected to a source of a FET, such as FET 206, which has its gate connected to the LO 42 and has its drain connected to ground 242. The pair of FETs 212 has drains that are connected together and connected to a FET 205, which has its gate connected to the inverted LO 43 and has its drain connected to ground 242.

For each bit of $D_1$ to $D_N$, the respective sources of each FET in each pair of FETs are connected together.

The circuit may be described as having a band pass ΣΔ modulator 302 having output bits $D_1$ to $D_N$, and inverted output bits for $D_1$ to $D_N$. A local oscillator has an output LO 42 and an inverted output for the LO 43.

Each bit of $D_1$ to $D_N$, and each inverted bit of $D_1$ to $D_N$ is connected to a respective gate of two respective pairs of FETs, the FETs in a respective pair of FETs having their drains connected.

Each source for a FET having an inverse of a bit connected to a gate of the FET is connected to a voltage source.

Each source for one FET of each respective pair of FETs having a bit that is not inverted connected to a gate of the FET is connected to an inductor in series with a resistor connected to the voltage source.

Each source for a second FET of each respective pair of FETs having a bit that is not inverted connected to a gate of the FET is connected to a second inductor in series with a second resistor connected to the voltage source.

The connected drains of one respective pair of FETs for each bit is connected to a source of a respective FET with a gate connected to the output LO and a drain connected to a ground.

The connected drains of the second respective pair of FETs for each bit is connected to a source of a FET with a gate connected to the inverted output for the LO and a drain connected to a ground.

The circuit has an output that is between the inductor and the resistor and has an inverted output that is between the second inductor and the second resistor.

The circuit 300 generates the needed signals for the coarse tracking filter 44 and provides fast switching. The outputs OUT 230 and the inverted OUT 232 are generated and are input to the coarse tracking filter 44.

Figure 10:
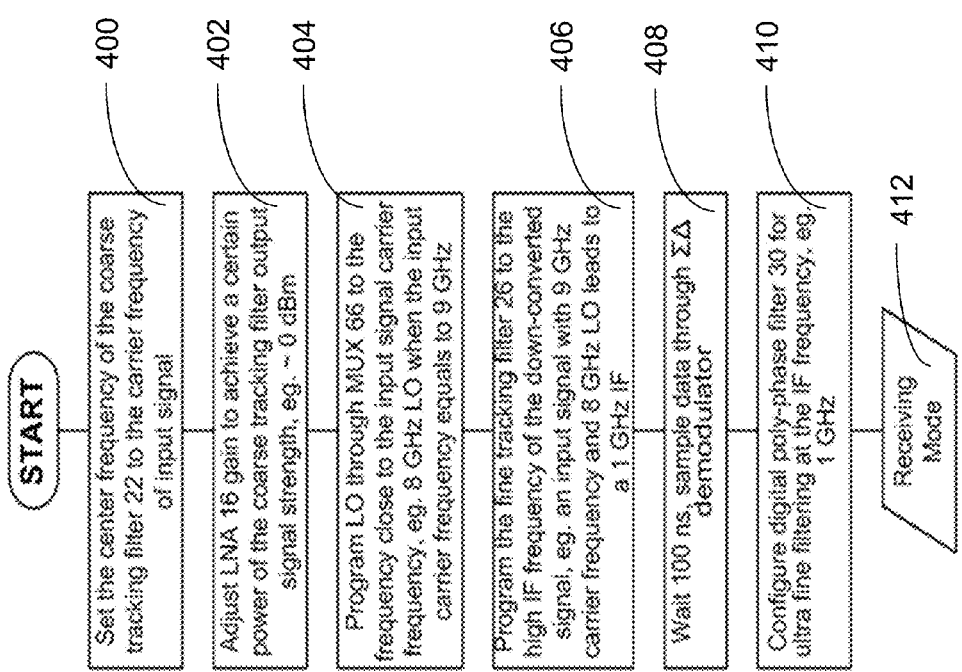
FIG. 10 shows a flow diagram for configuring the receive channel for a receive mode in accordance with the present disclosure.

FIG. 10 shows a flow diagram for configuring the receive channel for a receive mode in accordance with the present disclosure. In step 400 the center frequency of the coarse tracking filter 22 is set with control 62 to the carrier frequency of the input signal. Then in step 402 the gain of LNA 16 is adjusted to achieve a certain power at the output of the coarse tracking filter 22, for example 0 dBm. Next in step 404 the LO 86 is programmed through multiplexer (MUX) 66 to a frequency close to the signal carrier frequency. For example, a 8 GHz LO 86 is selected when the input signal carrier frequency equals 9 GHz. Then in step 406 the fine tracking filter 26 is programmed via control 63 to a high intermediate frequency (IF) of the down-converted signal. For example, an input signal with a carrier frequency of 9 GHz, will be mixed to a 1 GHz IF when the LO is 8 GHz. Next in step 408, waiting about 100 nanoseconds for data to be sent through the bandpass $\Sigma\Delta$ demodulator 28. Then in step 410, the digital poly-phase filter 30 is configured for ultra fine filtering at the IF frequency, for example 1 GHz. The digital poly-phase filter 30 is configured by changing digital coefficients in the filter 30, which is a programmable poly phase filter in digital implementation. With these settings the receive channel is set to a receive mode 412.

As discussed above, the coarse tracking filter 22 may have 5 options to partition the band into 0-4 GHz, 4-8 GHz, 8-12 GHz, 12-16 GHz, and 16-20 GHz. The LNA 16 may have three gain settings, for example: 0 dB, 15 dB and 30 dB. The fine tracking filter 26 may have has 20 selections to divide a 4 GHz band into 200 MHz bandwidths. Similarly, the $\Sigma\Delta$ demodulator 28 may have 20 selections to cover a 4 GHz band. The digital poly phase filter 30 may cover a 4 GHz band with programmable bandwidths, for example 100 kHz or tens of MHz.

Figure 11:
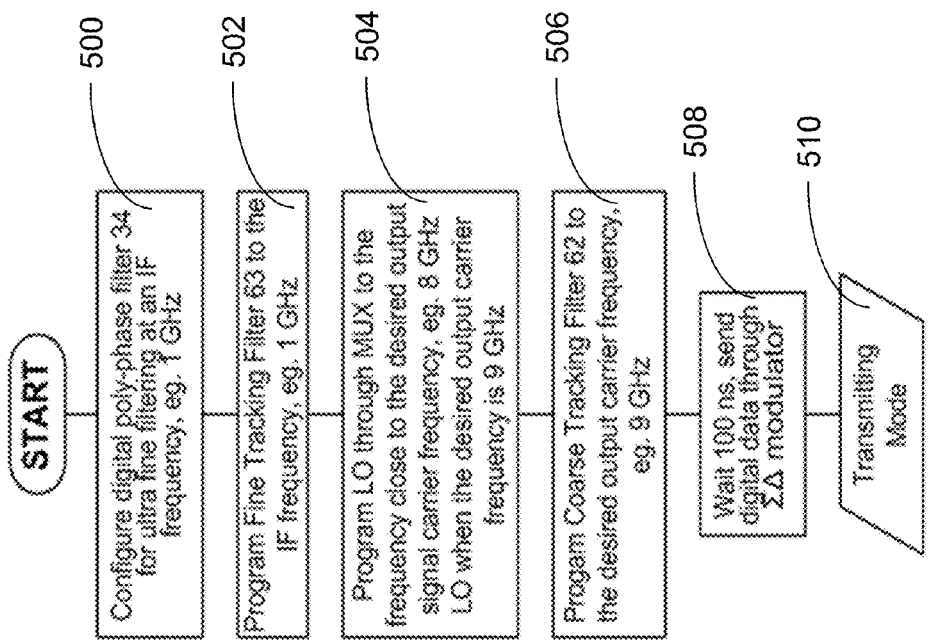
FIG. 11 shows a flow diagram for configuring the transmitter channel for a transmit mode in accordance with the present disclosure.

FIG. 11 shows a flow diagram for configuring the transmitter channel for a transmit mode in accordance with the present disclosure. In step 500, the digital poly-phase filter 34 is configured for ultra fine filtering at an IF frequency, for example 1 GHz. The digital poly-phase filter 34 is configured by changing digital coefficients in the filter 34. Then in step 502, the fine tracking filter 38 is programmed via control 63 to the intermediate frequency (IF), for example 1 GHz. Next in step 504 the LO 42 is programmed through MUX 66 to a frequency close to the desired output signal carrier frequency, for example an 8 GHz LO when the desired output carrier frequency is 9 GHz. Then in step 506, the coarse tracking filter 44 is programmed with control 62 to the desired output carrier frequency, for example 9 GHz. Then waiting in step 508 for about 100 nanoseconds data to be sent through the bandpass $\Sigma\Delta$ modulator 36. With these settings the transmit channel is set to a transmit mode 510.

The coarse tracking filter 44 may have 5 options to partition the band into 0-4 GHz, 4-8 GHz, 8-12 GHz, 12-16 GHz, and 16-20 GHz. The fine tracking filter 38 may have 20 selections to divide a 4 GHz band into 200 MHz bandwidths. Similarly, the $\Sigma\Delta$ modulator 36 may have 20 selections to cover a 4 GHz band. The digital poly phase filter 34 may cover a 4 GHz band with programmable bandwidths, for example 100 kHz or tens of MHz.

The receive channel and the transmitter channel may have their respective receive and transmit modes synchronized for particular applications, such as radar, in which the frequency of the receive channel needs to be the same as the frequency of the transmit channel. The transceiver according to the present disclosure provides agility for quickly changing frequencies so that a target would have difficulty in using electronic countermeasures to spoof the radar.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:
1. An agile transceiver comprising a receiver channel comprising:
    a coarse tracking filter coupled to an input, the coarse tracking filter configurable to operate at a selected one of at least two coarse frequency bands and to attenuate signals in the other frequency bands for filtering signals from the input;
    a mixer coupled to an output of the coarse tracking filter;

a selected local oscillator coupled to the mixer for mixing with the output of the coarse tracking filter and shifting a desired coarse pass band to near a base band;
a fine tracking filter for filtering the shifted and desired coarse pass band to a fine pass band; and
a band pass ΣΔ demodulator for converting signals in the fine pass band from analog into digital;
wherein the coarse tracking filter comprises N pass bands;
wherein the selected local oscillator comprises N−1 divided fixed frequencies derived from a fixed frequency;
wherein the fine tracking filter comprises M pass band selections to filter the desired coarse pass band to a desired fine pass band having a pass band of 1/M of the desired coarse pass band;
wherein the band pass ΣΔ demodulator comprises M selections for converting signals in the desired fine pass band from analog into digital; and
wherein N is an integer greater than 2.

2. The agile transceiver of claim 1 wherein the selected local oscillator comprises:
a fixed frequency synthesizer for generating a fixed frequency;
a set of dividers for dividing the fixed frequency by at least two different divide factors to generate at least two different divided fixed frequencies; and
a multiplexer for selecting one of the divided fixed frequencies to be the selected local oscillator.

3. The agile transceiver of claim 2 wherein:
the fixed frequency comprises 48 GHz;
the coarse tracking filter comprises 0-4 GHz, 4-8 GHz, 8-12 GHz, and 12-16 GHz pass bands; and
the set of dividers comprise divide factors of 12, 6, 4 and 3.

4. The agile transceiver of claim 1 further comprising a digital poly-phase processor for filtering an output of the band pass ΣΔ demodulator and shifting the output of the band pass ΣΔ demodulator to base band.

5. The agile transceiver of claim 1 wherein the input comprises:
an antenna; and
a low noise amplifier coupled to the antenna and coupled to the coarse tracking filter.

6. The agile transceiver of claim 1 further comprising:
a digital to analog converter coupled to an output of the digital poly-phase processor for converting the output of the digital poly-phase processor from digital to analog.

7. The agile transceiver of claim 1 wherein:
a settling time of the receive channel to switch from the lowest possible frequency to the highest possible frequency or from the highest possible frequency to the lowest possible frequency is less than 100 nanoseconds, or as low as 50.2 nanoseconds.

8. The agile transceiver of claim 1 wherein:
a settling time of the selected local oscillator is less than 10 nanoseconds, or as low as 0.2 nanoseconds; and
a band switching time of the fine tracking filter and the band pass ΣΔ demodulator is as low as 50 nanoseconds.

9. The agile transceiver of claim 1 further comprising a transmitter channel comprising:
a band pass ΣΔ modulator for converting signals from a transmit input from digital to analog;
a second fine tracking filter for filtering an output of the band pass ΣΔ modulator to a fine transmit pass band;
a second mixer coupled to an output of the second fine tracking filter;
a second selected local oscillator coupled to the second mixer for mixing with the output of the second fine tracking filter and shifting the fine transmit pass band to a desired coarse transmit pass band; and
a second coarse tracking filter coupled an output of the second mixer, the coarse tracking filter having a set of at least two bandpass filters, and the coarse tracking filter for filtering signals from the second mixer that are not in the desired coarse transmit pass band.

10. The agile transceiver of claim 9 wherein the second selected local oscillator comprises:
a second fixed frequency synthesizer for generating a fixed frequency;
a second set of dividers for dividing the fixed frequency by at least two different divide factors to generate at least two different divided fixed frequencies; and
a second multiplexer for selecting one of the divided fixed frequencies to be the selected local oscillator.

11. The agile transceiver of claim 10 wherein:
the second fixed frequency comprises 48 GHz;
the second coarse tracking filter comprises 0-4 GHz, 4-8 GHz, 8-12 GHz, and 12-16 GHz pass bands; and
the second set of dividers comprise divide factors of 12, 6, 4 and 3.

12. The agile transceiver of claim 9 further comprising a digital poly-phase processor for filtering and up conversion of signals from the transmit input.

13. The agile transceiver of claim 9 further comprising:
an antenna; and
a power amplifier coupled to the antenna and coupled to the coarse tracking filter.

14. The agile transceiver of claim 9 further comprising:
an analog to digital converter between the digital poly-phase processor and the transmit input for converting the transmit input from analog to digital.

15. The agile transceiver of claim 9 wherein:
a settling time of the transmit channel to switch from the lowest possible frequency to the highest possible frequency or from the highest possible frequency to the lowest possible frequency is less than 100 nanoseconds, or as low as 50.2 nanoseconds.

16. The agile transceiver of claim 9 wherein:
a settling time of the second selected local oscillator is less than 10 nanoseconds, or as low as 0.2 nanoseconds; and
a band switching time of the second fine tracking filter and the band pass ΣΔ modulator is as low as 50 nanoseconds.

17. The agile transceiver of claim 1, wherein said local oscillator is capable of producing multiple frequencies with a switching time not constrained by a frequency synthesizer loop constant.

18. The agile transceiver of claim 1 wherein:
N is 5; and
M is 20.

19. An agile transceiver comprising a transmitter channel comprising:
a band pass ΣΔ modulator for converting signals from a transmit input from digital to analog;
a fine tracking filter for filtering an output of the band pass ΣΔ modulator to a fine transmit pass band;
a mixer coupled to an output of the fine tracking filter;
a local oscillator coupled to the mixer for mixing with the output of the fine tracking filter and shifting the fine transmit pass band to a desired coarse transmit pass band; and a coarse tracking filter coupled to an output of the mixer, the coarse tracking filter configurable to operate at a selected one of at least two coarse frequency bands and to attenuate signals in the other frequency bands for filtering signals from the output of the mixer;

wherein the band pass ΣΔ modulator comprises M selections for converting transmit input signals in a desired fine pass band from analog into digital;

wherein the fine tracking filter comprises M pass band selections to pass the desired fine pass band and to filter signals from the band pass ΣΔ modulator that are not in the desired fine pass band;

wherein the local oscillator comprises N−1 divided fixed frequencies derived from a fixed frequency;

wherein the coarse tracking filter comprises N pass bands; and wherein N is an integer greater than 2.

20. The agile transceiver of claim 19 wherein the selected local oscillator comprises:
a fixed frequency synthesizer for generating a fixed frequency;
a set of dividers for dividing the fixed frequency by at least two different divide factors to generate at least two different divided fixed frequencies; and
a multiplexer for selecting one of the divided fixed frequencies to be the selected local oscillator.

21. The agile transceiver of claim 19 wherein:
a settling time of the transmit channel to switch from the lowest possible frequency to the highest possible frequency or from the highest possible frequency to the lowest possible frequency is less than 100 nanoseconds, or as low as 50.2 nanoseconds.

22. The agile transceiver of claim 19, wherein said local oscillator is capable of producing multiple frequencies with a switching time not constrained by a frequency synthesizer loop constant.

23. A circuit for implementing a band pass ΣΔ modulator, a mixer, and a fine tracking filter comprising:
a band pass ΣΔ modulator having output bits D1 to DN, where N is an integer larger than 1, and inverted output bits for D1 to DN;
a local oscillator (LO) having an output LO and an inverted output for the LO;
wherein each bit of D1 to DN, and each inverted bit of D1 to DN is connected to a respective gate of two respective pairs of FETs, the FETs in each pair of FETs having their drains connected;
wherein each source for a FET having an inverse of a bit connected to a gate of the FET is connected directly to a voltage source;
wherein each source for one FET of a respective pair of FETs having a bit that is not inverted connected to a gate of the FET is connected to an inductor connected to a resistor that is connected directly to the voltage source;
wherein each source for the second FET of a respective pair of FETs having a bit that is not inverted connected to a gate of the FET is connected to a second inductor connected to a second resistor that is connected directly to the voltage source;
wherein the connected drains of one respective pair of FETs for each bit is connected to a source of a respective FET with a gate connected to the output LO and a drain connected to a ground;
wherein the connected drains of the second respective pair of FETs for each bit is connected to a source of a respective FET with a gate connected to the inverted output for the LO and a drain connected to the ground; and
wherein N is an integer greater than 1.

24. The circuit of claim 23 wherein:
an output is between the inductor and the resistor; and
an inverted output is between the second inductor and the second resistor.

25. A method of providing an agile transceiver comprising a receiver channel comprising:
forming a coarse tracking filter coupled to an input, the coarse tracking filter configurable to operate at a selected one of at least two coarse frequency bands and to attenuate signals in the other frequency bands for filtering signals from the input;
forming a mixer coupled to an output of the coarse tracking filter;
forming a selected local oscillator coupled to the mixer for mixing with the output of the coarse tracking filter and shifting a desired coarse pass band to near a base band;
forming a fine tracking filter for filtering the shifted and desired coarse pass band to a fine pass band; and
forming a band pass ΣΔ demodulator for converting signals in the fine pass band from analog into digital
wherein the coarse tracking filter comprises N pass bands;
wherein the selected local oscillator comprises N−1 divided fixed frequencies derived from a fixed frequency;
wherein the fine tracking filter comprises M pass band selections to filter the desired coarse pass band to a desired fine pass band having a pass band of 1/M of the desired coarse pass band;
wherein the band pass ΣΔ demodulator comprises M selections for converting signals in the desired fine pass band from analog into digital; and
wherein N is an integer greater than 2.

26. The method of claim 25 wherein forming the selected local oscillator comprises:
forming a fixed frequency synthesizer for generating a fixed frequency;
forming a set of dividers for dividing the fixed frequency by at least two different divide factors to generate at least two different divided fixed frequencies; and
forming a multiplexer for selecting one of the divided fixed frequencies to be the selected local oscillator.

27. The method of claim 25 further comprising forming a digital poly-phase processor for filtering an output of the band pass ΣΔ demodulator and shifting the output of the band pass ΣΔ demodulator to base band.

28. The method of claim 25 wherein:
a settling time of the receive channel to switch from the lowest possible frequency to the highest possible frequency or from the highest possible frequency to the lowest possible frequency is less than 100 nanoseconds, or as low as 50.2 nanoseconds.

29. A method of providing an agile transceiver comprising a transmitter channel comprising:
forming a band pass ΣΔ modulator coupled to a transmit input for converting signals from the transmit input from digital to analog;
forming a fine tracking filter for filtering an output of the band pass ΣΔ modulator to a fine transmit pass band;
forming a mixer coupled to an output of the fine tracking filter;

forming a local oscillator coupled to the mixer for mixing with the output of the fine tracking filter and shifting the fine transmit pass band to a desired coarse transmit pass band; and forming a coarse tracking filter coupled to an output of the mixer, the coarse tracking filter configurable to operate at a selected one of at least two coarse frequency bands and to attenuate signals in the other frequency bands for filtering signals from the output of the mixer;

wherein the band pass ΣΔ modulator comprises M selections for converting transmit input signals in a desired fine pass band from analog into digital;

wherein the fine tracking filter comprises M pass band selections to pass the desired fine pass band and to filter signals from the band pass ΣΔ modulator that are not in the desired fine pass band;

wherein the local oscillator comprises N−1 divided fixed frequencies derived from a fixed frequency;

wherein the coarse tracking filter comprises N pass bands; and wherein N is an integer greater than 2.

30. The method of claim 29 wherein forming the selected local oscillator comprises:

forming a fixed frequency synthesizer for generating a fixed frequency;

forming a set of dividers for dividing the fixed frequency by at least two different divide factors to generate at least two different divided fixed frequencies; and forming a multiplexer for selecting one of the divided fixed frequencies to be the selected local oscillator.

31. The method of claim 29 wherein:

a settling time of the transmit channel to switch from the lowest possible frequency to the highest possible frequency or from the highest possible frequency to the lowest possible frequency is less than 100 nanoseconds, or as low as 50.2 nanoseconds.

32. The method of claim 29 further comprising forming a digital poly-phase processor coupled between the transmit input and the band pass ΣΔ modulator for fine filtering of the transmit input.

* * * * *